(12) United States Patent
Uda

(10) Patent No.: US 6,226,505 B1
(45) Date of Patent: May 1, 2001

(54) AUTOMATIC FREQUENCY CORRECTION APPARATUS AND METHOD FOR RADIO CALLING SYSTEM

(75) Inventor: Yoshihide Uda, Shizuoka (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/970,423

(22) Filed: Nov. 14, 1997

(30) Foreign Application Priority Data

Nov. 20, 1996 (JP) .................................................. 8-308557

(51) Int. Cl.[7] ............................... H04B 1/06; H04B 1/04; H04L 27/06
(52) U.S. Cl. ......................... 455/255; 455/132; 455/258; 375/344
(58) Field of Search ..................................... 455/133, 134, 455/135, 255, 256, 257, 258, 259, 264, 76, 115, 265, 132, 75; 375/344, 345, 375, 374

(56) References Cited

U.S. PATENT DOCUMENTS

| | | | |
|---|---|---|---|
| 4,733,874 | * | 3/1988 | Ichikawa .............................. 455/258 |
| 4,926,498 | * | 5/1990 | Suzuki et al. ........................ 455/135 |
| 5,239,697 | * | 8/1993 | Kosuga ................................. 455/133 |
| 5,335,364 | * | 8/1994 | Heinonen ............................... 455/76 |
| 5,444,736 | * | 8/1995 | Kawashima et al. ................ 375/219 |
| 5,634,205 | * | 5/1997 | Kurisu et al. ........................ 455/259 |
| 5,742,896 | * | 4/1998 | Bose et al. ........................... 455/135 |
| 5,757,864 | * | 5/1998 | Petranovich et al. ................ 375/344 |
| 5,805,643 | * | 9/1998 | Seki et al. ............................ 455/133 |
| 5,839,059 | * | 11/1998 | Hakkinen et al. .................... 455/115 |
| 5,940,744 | * | 8/1999 | Uda ...................................... 455/255 |
| 5,982,819 | * | 11/1999 | Womack et al. ..................... 375/316 |

FOREIGN PATENT DOCUMENTS

| | | |
|---|---|---|
| 58-1000 | 1/1983 | (JP) . |
| 60-79836 | 5/1985 | (JP) . |
| 60-176353 | 9/1985 | (JP) . |
| 62-250729 | 10/1987 | (JP) . |
| 63-26129 | 2/1988 | (JP) . |
| 2-154524 | 6/1990 | (JP) . |
| 3-70335 | 3/1991 | (JP) . |

OTHER PUBLICATIONS

Japanese Office Action, dated Jan. 12, 1999, with English language translation of Japanese Examiner' comments.
Japanese Office Action, dated Jun. 30, 2000, with English language translation of Japanese Examiner's comments.

* cited by examiner

*Primary Examiner*—Reinhard J. Eisenzopf
*Assistant Examiner*—Charles N. Appiah
(74) *Attorney, Agent, or Firm*—McGuireWoods LLP

(57) ABSTRACT

A frequency correction apparatus for a radio calling system includes reception antennas, local oscillation sections, demodulation sections, and a correction control section. The reception antennas receive call signals constituted by frames as units, each constituted by a frame synchronization portion and a data portion. The local oscillation sections generate local oscillation frequencies. The demodulation sections demodulate the received call signals after the call signals are converted into reception intermediate frequencies by using the local oscillation frequencies from the local oscillation section. The correction control section corrects the local oscillation frequency of the local oscillation section on the basis of frequencies of the frame synchronization portions of demodulated signals output from the demodulation section.

13 Claims, 4 Drawing Sheets

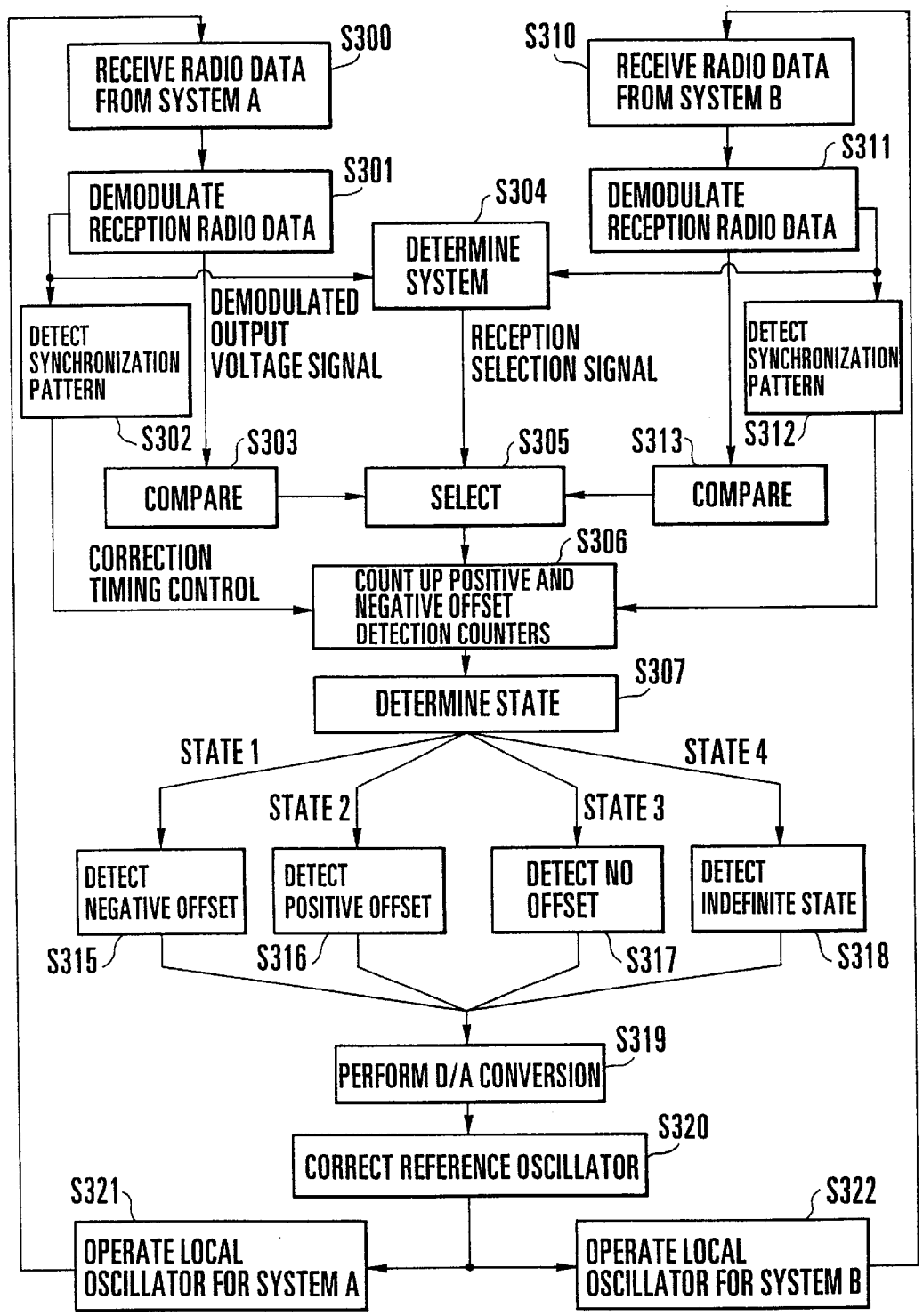
F I G. 3

AUTOMATIC FREQUENCY CORRECTION APPARATUS AND METHOD FOR RADIO CALLING SYSTEM

BACKGROUND OF THE INVENTION

The present invention relates to an automatic frequency correction apparatus and method for a radio calling system and, more particularly, to an automatic frequency correction apparatus and method which can be suitably used for a mobile station as a constituent of a radio calling system.

Some conventional radio calling systems of this type have automatic frequency correction apparatuses installed in mobile stations. For example, Japanese Patent Laid-Open No. 3-70335 discloses an automatic frequency correction apparatus installed in a mobile station. The automatic frequency correction apparatus described in this reference detects the error between a reception frequency and a local oscillation frequency in a specific interval of reception data from a transmitting base station, and selects correction data corresponding to the detected error, thereby controlling a reference oscillator. With this operation, the reference oscillator is matched with the reception frequency from the transmitting base station to allow the mobile station to perform accurate, stable reception and transmission control.

In a radio calling system of this type, however, to make the local oscillation frequency accurate and stable, each mobile station must use a high-precision oscillator such as a TCXO (Temperature Compensated X'tal Oscillator) and an automatic frequency correction circuit including special components such as a frequency meter and an A/D converter. For this reason, to improve the precision of the local oscillation frequency in each mobile station, the cost and the size of a control circuit inevitably increase, resulting in difficulty in satisfying demands for economical, small-size apparatuses.

In addition, since automatic frequency correction is executed on the basis of the reception frequency from a transmitting base station, a stable reception frequency cannot be obtained in a situation in which the reception ratio of reception signals is low. If a high-precision oscillator is used for this situation, a problem is posed in terms of cost performance.

Furthermore, when the reception ratio of reception signals is low, an automatic frequency correction section cannot execute a stable operation.

SUMMARY OF THE INVENTION

It is an object of the present invention to provide an automatic frequency correction apparatus and method which can obtain a stable reception ratio in a wide area.

It is another object of the present invention to provide an automatic frequency correction apparatus and method which allows a reduction in circuit scale.

In order to achieve the above objects, according to the present invention, there is provided a frequency correction apparatus for a radio calling system, comprising reception means for receiving call signals comprising a frame synchronization portion and a data portion, local oscillation means for generating local oscillation frequencies, demodulation means for demodulating the received call signals after the call signals are converted into reception intermediate frequencies by using the local oscillation frequencies from the local oscillation means, and frequency correction means for correcting the local oscillation frequency of the local oscillation means on the basis of frequencies of the frame synchronization portions of demodulated signals output from the demodulation means.

BRIEF DESCRIPTION OF THE DRAWINGS

FIG. 3 is a flow chart showing a procedure for executing frequency correction control in the mobile station in FIG. 1.

DESCRIPTION OF THE PREFERRED EMBODIMENT

The present invention will be described in detail below with reference to the accompanying drawings.

Figure 1:
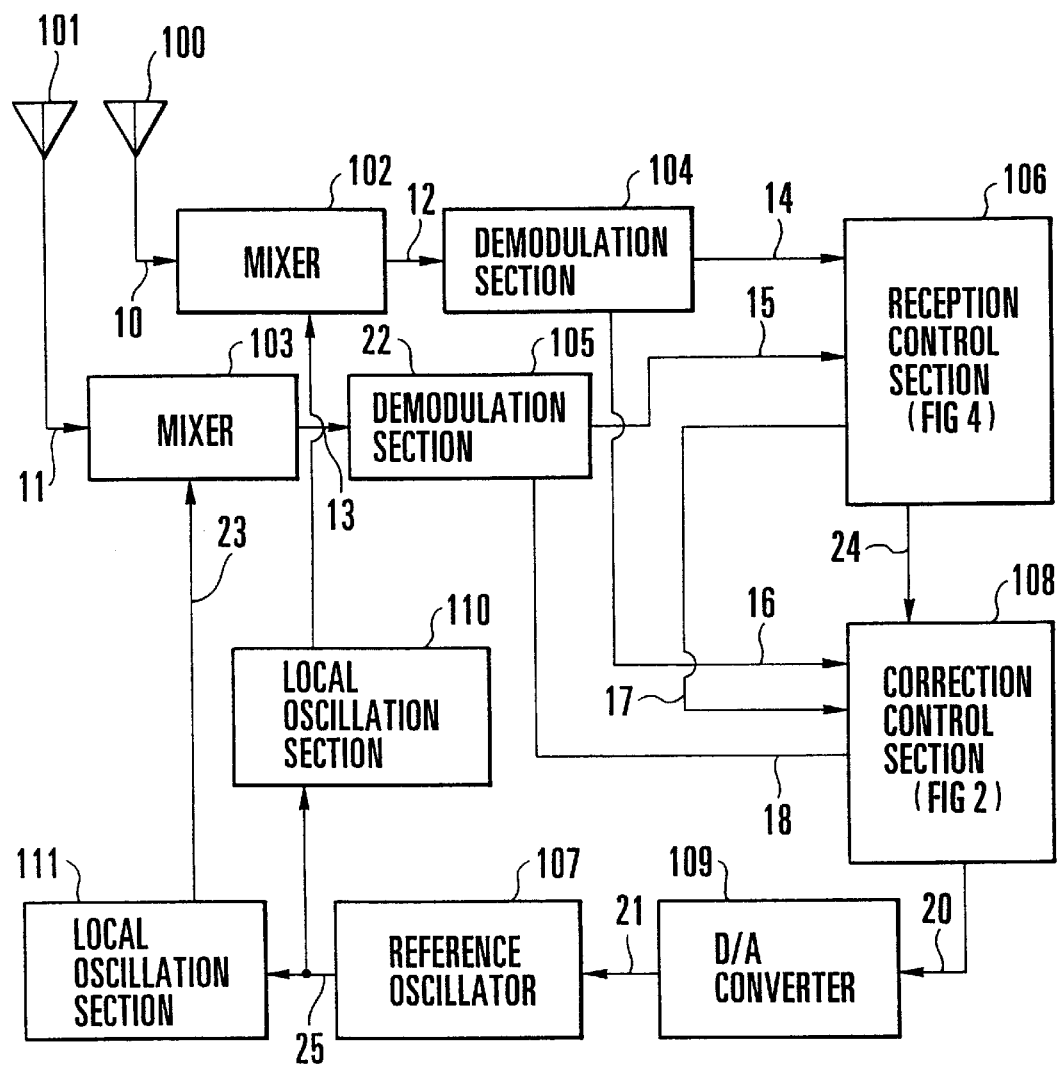
FIG. 1 is a block diagram showing a mobile station having an automatic frequency correction function according to an embodiment of the present invention.

FIG. 1 shows a mobile station having an automatic frequency correction function according to an embodiment of the present invention. Referring to FIG. 1, radio reception data 10 and 11 comprising frame synchronization portions and data portions from transmitting base stations in a plurality of radio calling systems (assume that these systems are systems A and B) are received by reception antennas 100 and 101. Mixers 102 and 103 respectively mix the radio reception data 10 and 11 with local oscillation frequencies 22 and 23 generated by local oscillation sections 110 and 111 to convert them into reception intermediate frequencies 12 and 13.

Demodulation sections 104 and 105 respectively convert the reception intermediate frequencies 12 and 13 into voltage values to output demodulated output voltage signals 14 and 15 (from which DC components are removed) for reception data processing, and demodulated output voltage signals 16 and 18 (from which no DC components are removed) for automatic frequency correction.

A reception control section 106 performs data processing for the demodulated output voltage signals 14 and 15. At this time, the reception control section 106 detects a timing for the execution of correction from the demodulated data 14 and 15, and outputs a correction timing control signal 24. At the same time, the reception control section 106 determines a radio calling system exhibiting the highest signal reception ratio on the basis of the demodulated data 14 and 15, and outputs a reception selection signal 17 indicating the radio calling system to be used for correction.

A correction control section 108 selects one of the demodulated output voltage signals 16 and 18 as the reception data from the radio calling system exhibiting the highest signal reception ratio in accordance with the reception selection signal 17, and detects a frequency error between the frequency of the frame synchronization portion and the local reference oscillation frequency in the reception data.

If there is a frequency error, the correction control section 108 selects correction amount data 20 preset in a memory (to be described later) in the correction control section 108 in accordance with the state of the frequency error, and outputs it to a D/A converter 109.

The D/A converter 109 performs digital/analog conversion of the correction amount data 20 to generate an analog output signal for local oscillation frequency correction, thereby correcting the frequency of a reference oscillator 107. The local oscillation sections 110 and 111 for the systems A and B respectively generate local oscillation frequencies 22 and 23 required for the systems A and B on the basis of a corrected reference oscillation frequency 25, and output the local oscillation frequencies 22 and 23 to the mixers 102 and 103.

Figure 4:
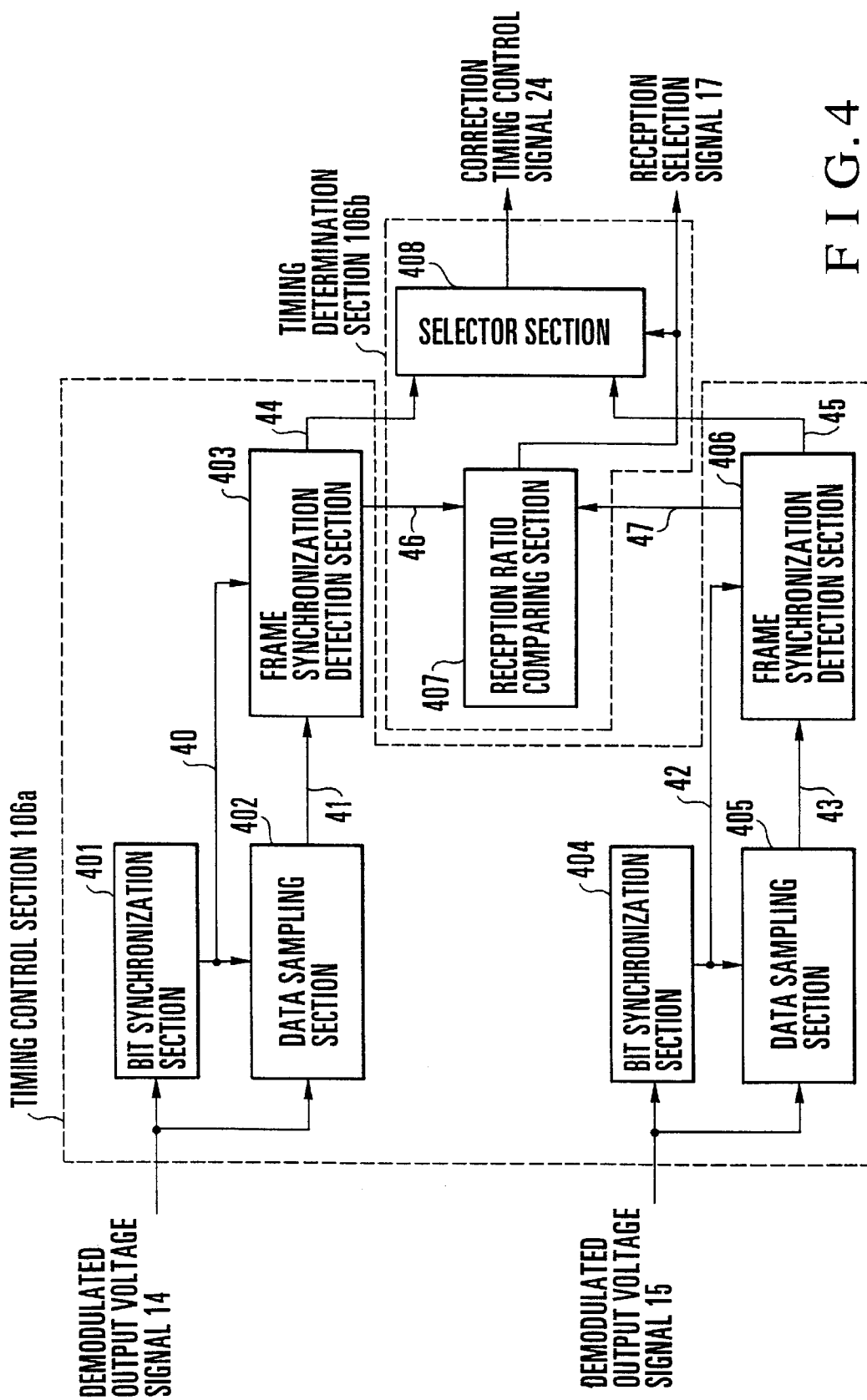
FIG. 4 is a block diagram showing the detailed arrangement of a reception control section in FIG. 1.

FIG. 4 shows the detailed arrangement of the reception control section 106 in FIG. 1. Referring to FIG. 4, in the reception control section 106, bit synchronization sections 401 and 404 of a timing control section 106a respectively output sampling reference clocks 40 and 42 synchronized with the signal bit rate (1,600 bps) on the basis of the demodulated output voltage signals 14 and 15. Data sampling sections 402 and 405 respectively sample the demodulated output voltage signals 14 and 15 in response to the sampling reference clocks 40 and 42 to output sampled data 41 and 43. Frame synchronization detection sections 403 and 406 respectively detect frame synchronization portions from the sampled data 41 and 43, and output reception ratio signals 46 and 47 indicating detection frequencies within a predetermined period of time. The frame synchronization detection sections 403 and 406 also calculate correction execution timings from the detection positions of the frame synchronization portions, and output signals, as correction timing signals 44 and 45, which are set at "H" level in a correction execution interval (more specifically, the interval between 0th bit and 16th bit of each frame synchronization portion).

A timing determination section 106b compares the reception ratio signals 46 and 47 with each other to determine a radio calling system exhibiting a high reception ratio, and outputs the reception selection signal 17 indicating the radio calling system to be used for correction. A selector section 408 selects one of the correction timing signals 44 and 45 to be used for correction in accordance with the reception selection signal 17, and outputs it as the correction timing control signal 24.

Figure 2:
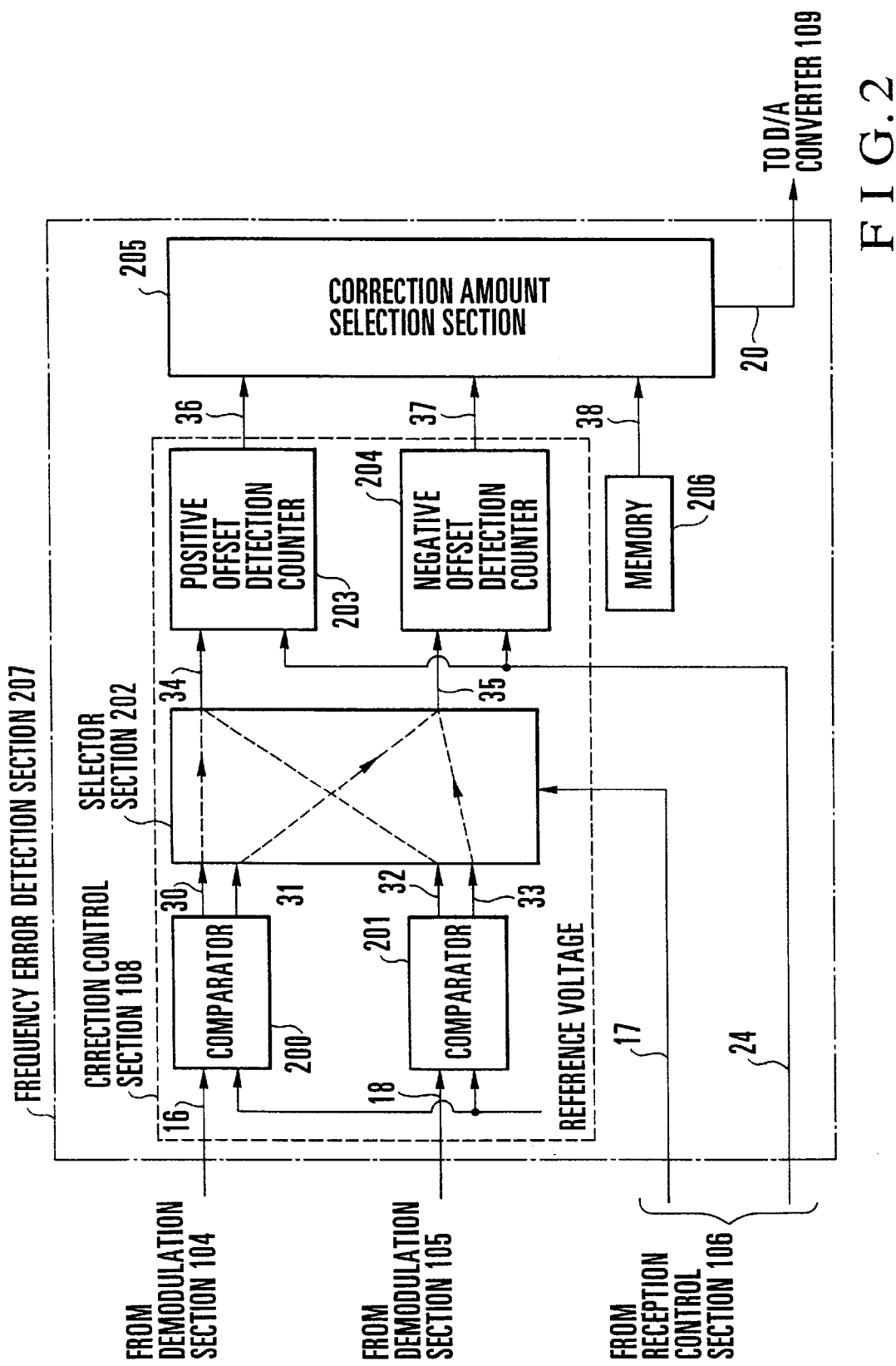
FIG. 2 is a block diagram showing the detailed arrangement of a correction control section in FIG. 1.

FIG. 2 shows the detailed arrangement of the correction control section 108 in FIG. 1. Referring to FIG. 2, since no DC components are removed from the demodulated output voltage signals 16 and 18 from the demodulation sections 104 and 105, an oscillation frequency offset appears as a variation in voltage value. To detect this, comparators 200 and 201 respectively compare demodulated output voltage signals 16 and 18 with upper and lower reference voltages in units of bits.

If one bit lower than the upper reference voltage is detected, a negative offset is determined. In this case, one pulse is deleted from each of negative offset determination results 31 and 33. If one bit higher than the lower reference voltage is detected, a positive offset is determined. In this case, one pulse is deleted from each of positive offset determination results 30 and 32. If there is no offset, pulses corresponding to the number of bits are output.

A selector section 202 selects offset determination results corresponding to a radio calling system exhibiting the highest signal reception ratio on the basis of the reception selection signal 17 from the reception control section 106. Offset detection counters 203 and 204 count up selected offset determination result outputs 34 and 35. If at least one of the count values of the offset detection counters 203 and 204 does not reach a predetermined value within a predetermined period of time, a frequency offset is determined. As a result, a positive offset counter result 36 and a negative offset count result 37, each consisting of a binary signal, are output.

A correction amount selection section 205 reads out correction amount data 38 from a memory 206 in accordance with a combination of the two offset count results 36 and 37, and outputs the data as the correction amount data 20 to the D/A converter 109. Reference numeral 207 denotes a frequency error detection section constituted by the comparators 200 and 201, the selector section 202, and the offset detection counters 203 and 204.

The operation of the mobile station having the above arrangement will be described next with reference to the flow chart of FIG. 3. When this mobile station starts receiving signals from the systems A and B at once, the demodulation sections 104 and 105 demodulate the reception signals into the reception intermediate frequencies 12 and 13 in steps S300, S301, S310, and S311. In steps S303 and S313, the comparators 200 and 201 of the correction control section 108 concurrently compare the demodulated output voltage signals 16 and 18 of the frame synchronization portions with the reference voltages in units of bits to perform frequency offset detection.

At the same time, in the correction control section 108, the timing control section 106a detects synchronization patterns from the demodulation results in steps S302 and S312, and outputs the correction timing control signal 24 through the timing determination section 106b. In step S304, the timing determination section 106b determines a radio calling system exhibiting the highest signal reception ratio from the demodulation results in accordance with the correction timing control signal 24, and outputs the reception selection signal 17 indicating the determination result. The selector section 202 of the correction control section 108 selects one of the comparison results from the comparators 200 and 201 which corresponds to the radio calling system, of the systems A and B, which exhibits the highest signal reception ratio in accordance with the reception selection signal 17 so as to use the selected comparison result for correction control.

The selected comparison result is counted by the offset detection counters 203 and 204 of the correction control section 108 in step S306. The offset detection counters 203 and 204 output the positive offset counter result 36 and the negative offset count result 37, each consisting of a binary value and indicating whether the count value has reached the predetermined value after a lapse of a predetermined period of time. In step S307, the correction amount selection section 205 of the correction control section 108 determines, on the basis of a combination of the count results 36 and 37 from the offset detection counters 203 and 204, whether the state of the frequency corresponds to one of states 1 to 4 indicated in steps S315 to S318.

If state 1 is determined in step S307, a negative offset is detected in step S315. If state 2 is determined, a positive offset is detected in step S316. If state 3 is determined in step S307, the absence of a frequency offset is detected in step S317. If state 4 is determined, an indefinite state corresponding none of the states in steps S315 to S317 is detected in step S318.

A case wherein the indefinite state is detected will be described in detail below. There are 16 bits (eight repetitions of "10") in a correction timing. If no offset is present, the count value of the positive offset detection counter 203 becomes "8", and the count value of the negative offset detection counter 204 becomes "8". If, for example, a positive frequency offset is present, the count value of the negative offset detection counter 204 remains "8", but the count value of the positive offset detection counter 203 does not reach "8". In this case, the indefinite state is a state in which a signal cannot be properly demodulated because of radio interference or a state in which a reception radio signal cannot be properly modulated because the electric field level of the signal is too low. In such a case, since an irregular demodulated voltage signal (which is not a 16-bit signal of eight repetitions of "01") is obtained, the count values of both the positive and negative offset detection counters 203 and 204 do not reach "8". Therefore, frequency correction is not executed in the indefinite state in which both the counters 203 and 204 do not reach the predetermined count value, because the execution of frequency correction based on erroneously demodulated data results in a deterioration in reliability.

If the absence of a frequency offset and the indefinite state are respectively detected in steps S317 and S318, the correction amount selection section 205 of the correction control section 108 sets the correction amount data to level 0 of the previous data. If frequency offsets are respectively detected in steps S315 and S316, the correction amount selection section 205 reads out the corresponding correction amount data 20 from the correction amount data 38 in the memory 206 on the basis of the offset count results 36 and 37. The readout correction amount data 20 is converted from a digital amount to an analog amount by the D/A converter 109.

In step S320, correction of the reference oscillator 107 is performed. In steps S321 and S322, the local oscillation sections 110 and 111 for the systems A and B oscillate corrected local frequencies. The flow then returns to steps S300 and S310 to repeat the above processing.

In steps S302 and S312, the reception control section 106 recognizes the position of a frame upon detection of synchronization patterns, and activates the correction timing control signal 24 at the position of an alternating pattern to execute correction. The counters 203 and 204 are enabled when the correction timing control signal 24 is active. When the correction timing control signal 24 is inactive, the counters 203 and 204 are reset to "0". After a lapse of a predetermined period of time during which the frequencies of the frame synchronization portions are counted, one of the four states, i.e., states 1 to 4, is determined on the basis of a combination of the two count results output from the counters 203 and 204, as described above.

States 1 to 4 described above will be described in more detail below. State 1 is a state in which a negative offset is detected, so that the negative offset detection counter 204 has not counted up to the predetermined value, but the positive offset detection counter 203 has counted up to the predetermined value.

State 2 is a state in which a positive offset is detected, so that the positive offset detection counter 203 has not counted up to the predetermined value, but the negative offset detection counter 204 has counted up to the predetermined value.

State 3 is a state in which no frequency offset is detected, so that both the positive and negative offset detection counters 203 and 204 have counted up to the predetermined value. State 4 is an indefinite state in which both the positive and negative offset detection counters 203 and 204 have not counted up to the predetermined value.

The correction amount selection section 205 selects a required level from correction amount data of a plurality of levels which are stored in the memory 206 on the basis of the state determination result. The correction amount selection section 205 selects data of an intermediate level from the correction amount data of several levels which are stored in the memory 206. The correction control section 108 performs the above state determining operation in units of frames. If state 1 is determined, correction amount data higher than the correction amount data selected at the previous frame by one level is selected. If state 2 is determined, correction amount data lower than the correction amount data selected at the previous frame by one level is selected. If state 3 or 4 is determined, the same correction amount data as that selected at the previous frame is selected. The correction amount data 20 selected in this manner is then output.

The correction amount data 20 is used to control the reference oscillator 107 through the D/A converter 109 so as to correct the reference oscillation frequency 25. The local oscillation sections 110 and 111 respectively generate the local oscillation frequencies 22 and 23 on the basis of the reference oscillation frequency 25, and output them to the mixers 102 and 103.

As a result, the local oscillation sections 110 and 111 for the systems A and B are corrected regardless of whether frequency correction is performed by using the self-reception frequencies, thereby allowing correction of the local frequency signal of the self-system by using the reception frequency of another system. By repeating the above series of operations in units of frames, automatic frequency correction is always executed to stabilize the oscillation frequency of each local oscillator.

According to this embodiment, in a mobile station capable of receiving signals from a plurality of systems, even when a reception signal is to be received from a system exhibiting a low reception ratio, automatic correction control for the local oscillation frequency of the system from which a signal is to be received can be performed by detecting an error in a reference oscillator on the basis of the frequency of a frame synchronization portion in a system exhibiting a high signal reception ratio. With this operation, the reliability of local oscillation frequency correction can be improved.

In the above embodiment, call signals are received from the two radio calling systems. As is obvious, however, the present invention can be applied to a case wherein call signals are received from three or more radio calling systems.

As has been described above, according to the present invention, the error between a reception frequency and an oscillation frequency need not be detected by a complicated circuit arrangement including an A/D converter, a frequency meter, and the like, and the error between a reception frequency and the oscillation frequency of the reference oscillator can be detected by only using the comparators and the counter circuits. The circuit can therefore be reduced in size, and a reduction in cost can be attained.

In addition, when automatic frequency correction is executed by using the reception frequency of a system, which should be received, no complicated control circuit is required, and correction is executed by using another system for which automatic frequency control can be easily executed. With this operation, the precision of the oscillation frequency of the system from which a signal is to be received can be improved.

Even if the reception ratio of the system from which a signal is to be received is low, automatic frequency correction of the local oscillation frequency can be realized by using the reception frequency of a radio selective calling receiver which can obtain a stable reception ratio in a wide area. For this reason, for example, in a system including many areas where the reception ratios are relatively low, e.g., a personal handy-phone system (PHS), stable reception and transmission control can be realized without using a high-precision oscillator.

What is claimed is:

1. A frequency correction apparatus for a radio calling system, comprising:

first and second reception means for receiving call signals comprising frames, each of said frames comprising a frame synchronization portion and a data portion;

first and second local oscillation means for generating local oscillation frequencies for converting said call signals received by said first and second reception means into intermediate frequencies;

demodulation means for demodulating the intermediate frequencies;

frequency correction means for correcting the local oscillation frequencies of said first and second local oscillation means on the basis of frequencies of the frame synchronization portions of demodulated signals output from said demodulation means;

timing detection means for outputting a correction timing signal for execution of correction based on the demodulated signals output from said demodulation means, and a signal indicating a signal reception ratio of each of said first and second reception means; and determination means for determining one of said first and second reception means exhibiting a highest signal reception ratio on the basis of the signal indicating the signal reception ratio.

2. A frequency correction apparatus for a radio calling system, comprising:

first and second reception means for receiving call signals comprising frames, each of said frames comprising a frame synchronization portion and a data portion;

first and second local oscillation means for generating local oscillation frequencies for converting said call signals received by said first and second reception means into intermediate frequencies;

demodulation means for demodulating the intermediate frequencies; and frequency correction means for correcting the local oscillation frequency of said first and second local oscillation means on the basis of frequencies of the frame synchronization portions of demodulated signals output from said demodulation means, wherein said frequency correction means comprises:

error detection means for detecting a frequency error between the frequency of the frame synchronization portion of the demodulated signal output from said demodulation means and the local oscillation frequency from said first and second local oscillation means, and correction amount control means for outputting a signal indicating a correction amount of the local oscillation frequency for said first and second local oscillation means on the basis of a signal indicating the frequency error from said error detection means.

3. An apparatus according to claim 2, further comprising a memory in which correction amount data corresponding to a frequency error is preset, and wherein said correction amount control means reads out correction amount data from said memory in accordance with the signal indicating the frequency error from said error detection means, and correcting the local oscillation frequency of said first and second local oscillation means on the basis of the readout correction amount data.

4. An apparatus according to claim 2, wherein said first and second reception means comprise first and second antennas for receiving call signals, said demodulation means comprises first and second demodulation sections for demodulating reception signals from said first and second antennas and outputting demodulated signals containing DC components, said error detection means comprises:

first and second comparators for comparing bit voltages of the demodulated signals from said first and second demodulation sections with upper and lower limit reference voltages;

a selector for selecting one of a pair of upper and lower limit comparison results from said first and second comparators on the basis of a reception selection signal indicating one of said first and second reception means exhibiting a highest signal reception ratio; and first and second counters for respectively counting upper and lower limit comparison results output from said selector, and outputting count results, as signals indicating correction amount errors, which indicate whether count values have reached a predetermined value, said correction control means determines on the basis of a combination of the count results from said first and second counters whether the local oscillation frequency of said first and second local oscillation means is corrected, and controls a correction amount.

5. An apparatus according to claim 4, further comprising:

timing control means for recognizing a position of a frame in accordance with a synchronization pattern contained in a demodulated signal from said demodulation means, and activating a timing control signal, and wherein said first and second counters are enabled when the timing control signal is active, and are reset when the timing control signal is inactive.

6. An apparatus according to claim 4, wherein said correction amount control means outputs correction amount data higher than correction amount data selected at a previous frame by one level if the combination of the count results from said first and second counters is in state 1 indicating detection of a negative offset, outputs correction amount data lower than the correction amount data selected at the previous frame by one level if the combination is in state 2 indicating detection of a positive offset, and outputs the same correction amount data as that selected at the previous frame if the combination is in state 3 indicating the absence of an offset and in state 4 indicating an indefinite state.

7. A frequency correction apparatus for a radio calling system, comprising:

first and second reception means for receiving call signals comprising frames, each of said frames comprising a frame synchronization portion and a data portion;

first and second local oscillation means for generating local oscillation frequencies for converting said call signals received by said first and second reception means into intermediate frequencies;

demodulation means for demodulating the intermediate frequencies;

frequency correction means for correcting the local oscillation frequency of said first and second local oscillation means on the basis of frequencies of the frame synchronization portions of demodulated signals output from said demodulation means;

timing detection means for outputting a correction timing signal for execution of correction based on the demodulated signals output from said demodulation means, and a signal indicating a signal reception ratio of each of said first and second reception means; and determination means for determining one of said first and second reception means exhibiting a highest signal reception ratio on the basis of the signal indicating the signal reception ratio, wherein said determination means outputs a reception selection signal indicating one of said first and second reception means exhibiting the highest signal reception ratio, and said frequency correction means selects a frequency of a frame synchronization portion of a call signal from one of said first and second reception means exhibiting the highest signal reception ratio in accordance with the reception selection signal from said determination means and corrects the local oscillation frequency of said first and second local oscillation means on the basis of the selected frequency.

8. A frequency correction method comprising the steps of:

receiving call signals transmitted from a plurality of radio calling systems, said signals comprising frames having a frame synchronization portion and a data portion;

converting said call signals into reception intermediate frequencies using local oscillation frequencies, and demodulating the signals;

determining a radio calling system exhibiting a highest signal reception ratio on the basis of demodulated signals;

detecting a frequency error between a frequency of a frame synchronization portion of a call signal from the radio calling system determined as the radio calling system exhibiting the highest signal reception ratio and the local oscillation frequency; and correcting the local oscillation frequency on the basis of a signal indicating the detected frequency error.

9. A method according to claim 8, further comprising the step of detecting a timing at which frequency correction is executed on the basis of a synchronization pattern contained in demodulated data, and a signal reception ratio of each radio calling system, wherein the step of determining the radio calling system comprises determining a radio calling system exhibiting a highest signal reception ratio from the detected signal reception ratio of each radio calling system.

10. A method according to claim 8, wherein the step of correcting the local oscillation frequency comprises the steps of:

reading out correction amount data stored in advance from a memory in accordance with a signal indicating a detected frequency error; and correcting the local oscillation frequency on the basis of the readout correction amount data.

11. A method according to claim 8, wherein the step of determining the radio calling system comprises the steps of:

recognizing a position of a frame in accordance with a synchronization pattern contained in a demodulated signal, and activating a timing control signal;

enabling a frequency error detecting operation when the timing control signal is activated; and resetting the frequency error detecting operation when the timing control signal is inactivated.

12. A radio having automatic local oscillator frequency correction, comprising:

first and second radio receiver means each for receiving a radio signal comprising a plurality of frames, each frame comprising frame synchronization data;

first and second local oscillators for producing a frequency for mixing with said radio signals received by said first and second radio receiver means to produce first and second intermediate frequency signals;

first and second demodulation means for demodulating said first and second intermediate frequency signals, each of said first and second demodulation means outputting a first demodulated signal with a DC offset and a second demodulated signal with removed DC offset;

a reception control circuit for comparing said second demodulated signals with removed DC offset to select one of said first and second radio receiver means having a highest signal reception ratio and determining a frequency error said corresponding first or second local oscillator based on said frame synchronization data; and a frequency correction control circuit for comparing said first demodulated signals with said DC offset to upper and lower reference voltage signals to output a bit value signal indicating an amount of frequency offset wherein said corresponding first or second local oscillator is automatically adjusted based on said bit value signal.

13. A radio having automatic local oscillator frequency correction as recited in claim 12, wherein said frequency correction control circuit comprises:

a positive offset detection counter for determining a positive frequency offset from said bit value signal;

a negative offset detection counter for determining a negative frequency offset from said bit value signal; and a correction amount circuit connected to said positive and negative offset detection counters for outputting a signal indicating an amount of frequency correction needed.

* * * * *